United States Patent
Baeckler

(10) Patent No.: US 7,640,528 B1
(45) Date of Patent: Dec. 29, 2009

(54) HARDWARE ACCELERATION OF FUNCTIONAL FACTORING

(75) Inventor: Gregg William Baeckler, San Jose, CA (US)

(73) Assignee: Altera Corporation, San Jose, CA (US)

(*) Notice: Subject to any disclaimer, the term of this patent is extended or adjusted under 35 U.S.C. 154(b) by 449 days.

(21) Appl. No.: 11/499,514

(22) Filed: Aug. 4, 2006

(51) Int. Cl.
*G06F 17/50* (2006.01)
*H03K 19/00* (2006.01)

(52) U.S. Cl. .............. 716/17; 716/1; 716/2; 716/3
(58) Field of Classification Search .......... 716/1, 716/2, 3, 17
See application file for complete search history.

(56) References Cited

U.S. PATENT DOCUMENTS

| | | | | |
|---|---|---|---|---|
| 4,631,750 A | * | 12/1986 | Gabriel et al. | 382/277 |
| 4,944,009 A | * | 7/1990 | Micali et al. | 380/46 |
| 6,912,700 B1 | * | 6/2005 | Franco et al. | 716/5 |
| 2002/0124035 A1 | * | 9/2002 | Faber et al. | 708/400 |

* cited by examiner

*Primary Examiner*—Stacy A Whitmore
*Assistant Examiner*—Magid Y Dimyan
(74) *Attorney, Agent, or Firm*—Townsend and Townsend and Crew LLP

(57) ABSTRACT

A hardware accelerator factors functions during the compilation of a user design. The hardware accelerator includes cofactor units, each adapted to determine a cofactor of a function in response to a specified factorization and a set of input values. The factorization specifies the constant function inputs and varying function inputs. Each cofactor unit determines the cofactor of the function in response to a different constant value. The hardware accelerator operates all of the cofactor units simultaneously to determine some or all of the cofactors of a function for a factorization in parallel. Signature generators determine attributes of the cofactors. A signature analyzer uses these attributes to identify identical cofactors, constant cofactors, and inverse cofactors. The signature analyzer returns potentially optimal factorizations to compilation software applications for possible incorporation into user designs. The hardware accelerator may be implemented using a programmable device, such as the FPGA or other programmable device.

36 Claims, 11 Drawing Sheets

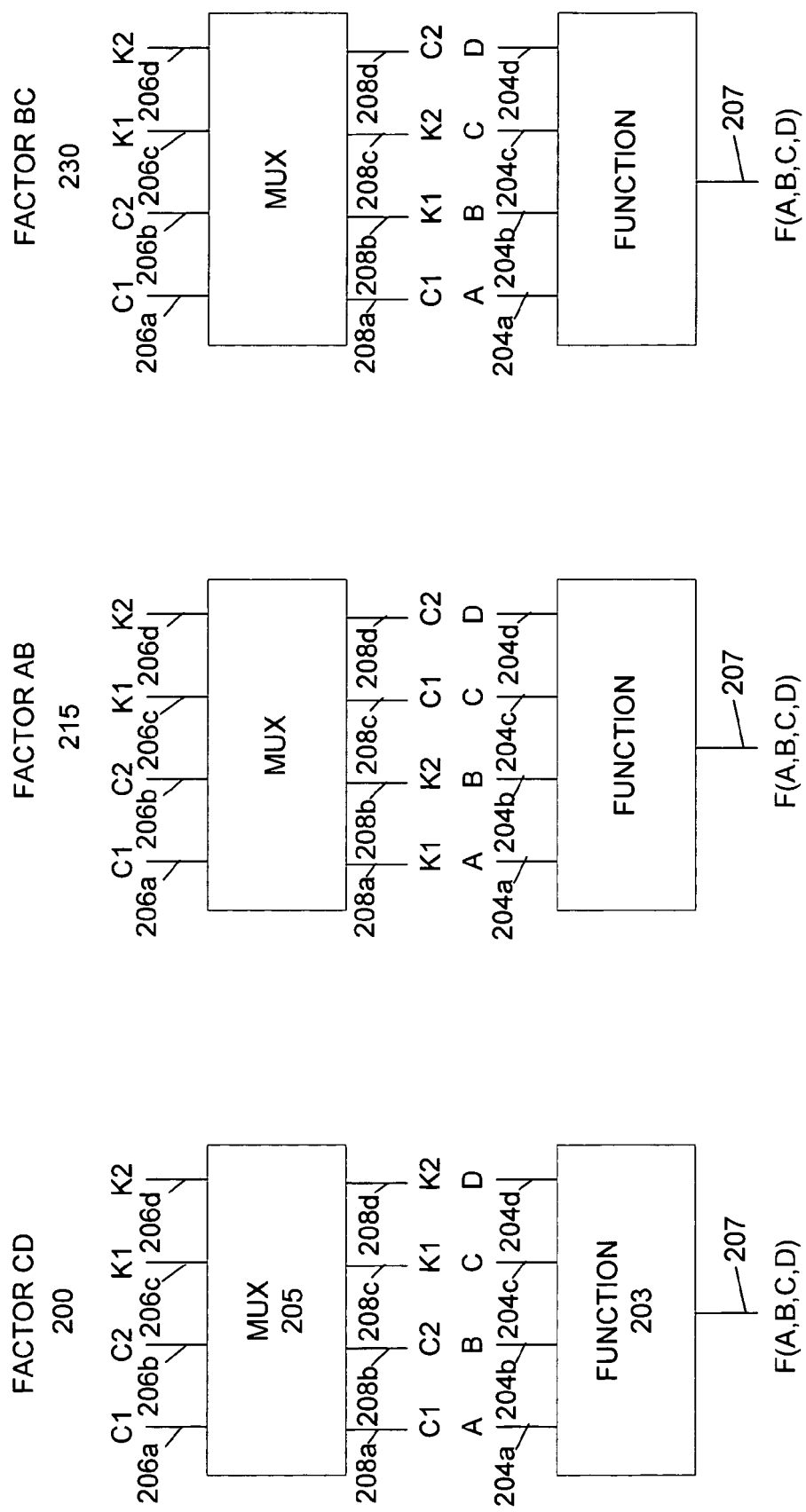

| A | B | C | D | F | |
|---|---|---|---|---|---|
| 0 | 0 | 0 | 0 | 0 | —302a |
| 0 | 0 | 0 | 1 | 0 | —303a |
| 0 | 0 | 1 | 0 | 0 | —304a |
| 0 | 0 | 1 | 1 | 0 | —305a |
| 0 | 1 | 0 | 0 | 0 | —302b |
| 0 | 1 | 0 | 1 | 1 | —303b |
| 0 | 1 | 1 | 0 | 1 | —304b |
| 0 | 1 | 1 | 1 | 1 | —305b |
| 1 | 0 | 0 | 0 | 0 | —302c |
| 1 | 0 | 0 | 1 | 1 | —303c |
| 1 | 0 | 1 | 0 | 1 | —304c |
| 1 | 0 | 1 | 1 | 1 | —305c |
| 1 | 1 | 0 | 0 | 0 | —302d |
| 1 | 1 | 0 | 1 | 1 | —303d |
| 1 | 1 | 1 | 0 | 1 | —304d |
| 1 | 1 | 1 | 1 | 1 | —304e |

HARDWARE ACCELERATION OF FUNCTIONAL FACTORING

BACKGROUND OF THE INVENTION

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and one or more embedded memory array blocks. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

The process of determining the configuration of a programmable device from a user-specified design is referred to as compilation. Typical compilation processes start with an extraction phase, followed by a logic synthesis phase, a clustering and placement phase, a routing phase, and an assembly phase. The extraction phase takes a user design, typically expressed as a netlist in a hardware description language such as Verilog or VHDL, and produces a set of logic gates implementing the user design. In the logic synthesis phase, the set of logic gates is permuted over the hardware architecture of the programmable device in order to match elements of the user design with corresponding portions of the programmable device.

Compilation software applications often must optimize a user design to match the architectural characteristics of the programmable device. These optimizations often change portions of the user design into functionally-equivalent circuits that are better suited for implementation by the programmable device. Compilation software applications may also optimize the user design to increase the operating speed, decrease the number of logic gates and other hardware resources required by the design, and/or decrease the power consumption.

For example, a logic cell of a programmable device may have a predetermined number of inputs. This allows the logic cell to potentially implement a Boolean function having up to that number of inputs. For a function with more inputs than are available in a single logic cell, the function must be split into sub-functions implemented by multiple logic cells. There are numerous techniques for manipulating designs to match hardware architectures and optimize performance.

Functional factoring is one approach to manipulating functions in designs to match hardware architectures and optimize performance. Functional factoring manipulates a truth table or binary decision diagram (BDD) representing a function to re-express the function as a combination of smaller functions.

Functional factoring is often extremely time-consuming, with complex functions taking days or even weeks of computational time to solve. Part of the reason for this is that functional factoring must separately analyze every possible factorization of a function to determine an optimal factorization of the function. Thus, as the number of function inputs increase, the number of possible factorizations considered increases exponentially. Additionally, complex functions often have a truth table or BDD representation too large to fit into most conventional processor caches. Because of this, functional factoring algorithms often incur frequent cache misses as they access a function's truth table or BDD, further increasing computation time.

Moreover, functional factoring algorithms typically factor one function at a time. In some cases, an optimal factorization of a first function may be adversely impact the factorization of a second related function. Conversely, sub-optimal factorizations of two or more separate functions may be optimal for the entire design due to the ability to share one or more sub-functions between the functions. Prior functional factoring algorithms cannot find an optimal factorization of the combination of two or more functions.

It is therefore desirable for a system and method to perform functional factoring in substantially less time than prior techniques. It is also desirable for the system and method to enable optimal factorization of the combination of two or more functions. It is further desirable for the system and method to be implemented with little or no additional cost over typical design development systems.

BRIEF SUMMARY OF THE INVENTION

An embodiment of the invention uses a hardware accelerator to perform function factoring during the compilation of a user design. The hardware accelerator includes a number of cofactor units. Each cofactor unit includes logic for determining a cofactor of a function in response to a specified factorization and a set of input values. The factorization specifies which function inputs are held to a constant value and which function inputs can vary. Each cofactor unit determines the cofactor of the function in response to a different constant value. In an embodiment, the number of cofactor units is greater than or equal to the total possible number of different cofactors of the function for a factorization. This allows the hardware accelerator to determine all of the cofactors of a function for a specified factorization in parallel.

In an embodiment, each cofactor unit further includes a signature generator for determining one or more attributes of a cofactor. These attributes are used by a signature analyzer to identify sets of two or more identical cofactors, to identify cofactors that are constant, and to identify cofactors that are the inverse of other cofactors. The signature analyzer compares the attributes of cofactors for a factorization against one or more criteria to determine if the factorization is potentially optimal. Potentially optimal factorizations are returned to compilation software applications for possible incorporation into user designs. The hardware accelerator may repeat this analyze for some or all of the possible factorizations of the function.

In an embodiment, the hardware accelerator is implemented using a programmable device, such as the FPGA or other programmable device included in many programmable device development kits. Thus, a user developing a design for a programmable device may use their programmable device development kit as an accelerator for compilation at no additional cost. In other applications, a dedicated hardware accelerator, implemented as an ASIC or on a programmable device, may be connected with the user's computer as an expansion card in the computer's expansion card slot or as a processor card adapted to interface with a processor slot or socket.

BRIEF DESCRIPTION OF THE DRAWINGS

The invention will be described with reference to the drawings, in which:

FIGS. 2A-2F illustrate example multiplexer configurations suitable for use with an embodiment of the invention;

FIGS. 3A-3C illustrate the operation of an embodiment of the invention in evaluating a factorization of an example function;

DETAILED DESCRIPTION OF THE INVENTION

An embodiment of the invention uses a hardware accelerator to perform function factoring during the compilation of a user design. In an embodiment, the hardware accelerator is implemented using a programmable device, such as the FPGA or other programmable device included in many programmable device development kits. Thus, a user developing a design for a programmable device may use their programmable device development kit as an accelerator for compilation at no additional cost. In other applications, a dedicated hardware accelerator, implemented as an ASIC or on a programmable device, may be connected with the user's computer as an expansion card in the computer's expansion card slot or as a processor card adapted to interface with a processor slot or socket.

Figure 1:
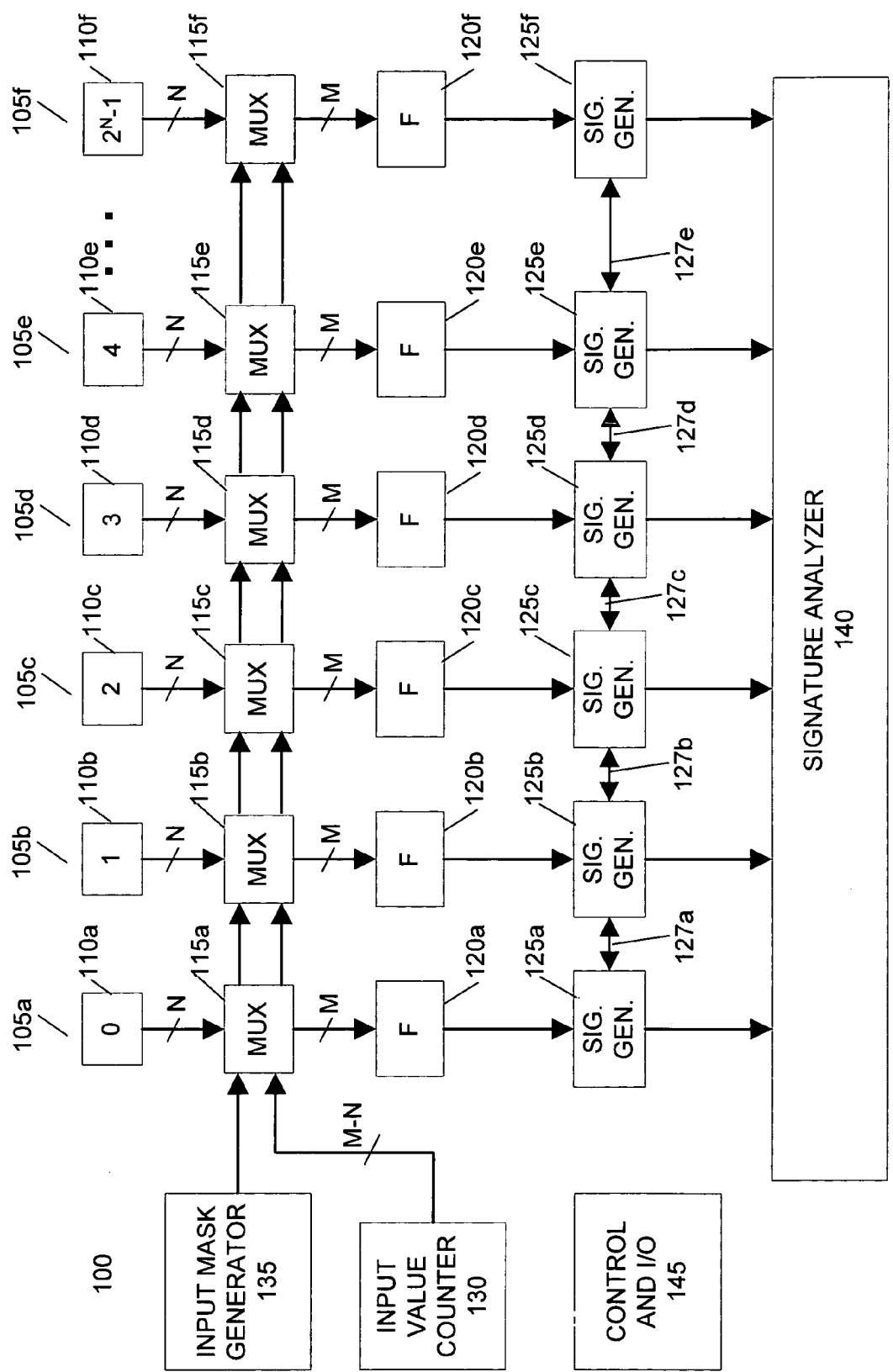
FIG. 1 illustrates a function factoring accelerator system according to an embodiment of the invention.

FIG. 1 illustrates a function factoring accelerator system 100 according to an embodiment of the invention. Function factoring accelerator system 100 is adapted to determine an optimal factorization of an M input function, where M is any arbitrary positive integer, as a combination of a N input sub-function and a M-N input sub-function, where N is any arbitrary positive integer less than M. Typically, the only limit on the size of M and N is amount of available memory and programmable device resources.

Function factoring accelerator system 100 includes a set of cofactor units 105, such as cofactor units 105a, 105b, 105c, 105d, 105e, and 105f. In an embodiment, the set of cofactor units 105 includes a total of at least $2^N$ cofactor units. Each of the set of cofactor units is adapted to evaluate a factorization of the function for a cofactor of the function. A cofactor is the portion of a function's truth table or BDD that remains when one or more inputs are set to a constant value. In this embodiment, a N input sub-function is factored from the given M input function. As the N input sub-function has $2^N$ possible input values, there are $2^N$ possible cofactors for each N input factorization of the function. By including $2^N$ cofactors units in the set of cofactor units 105, the function factoring accelerator system 100 can evaluate all of the cofactors of each factorization of the function in parallel.

In an alternate embodiment, the set of cofactor units 105 includes less than $2^N$ cofactor units. In this embodiment, some cofactors of each factorization of the function can be evaluated sequentially.

Each of the set of cofactor units 105 includes a constant unit 110, such as constant unit 110a in cofactor unit 105a. The constant units 110 outputs a constant value corresponding with the value of one of the cofactors of a function. For example, constant unit 110a outputs a value (in binary) of 0, constant unit 110b outputs a value of 1, constant unit 110c outputs a value of 2, constant unit 110d outputs a value of 3, constant unit 110e outputs a value of 4, and constant unit 110f outputs a value of $2^N-1$. In this arrangement, the $2^N$ constant units 110 output all $2^N$ cofactor values of a factorization of function. As discussed in detail below, the function factoring accelerator 100 will evaluate multiple (or all) of the possible factorizations of the function; however, in an embodiment, the outputs of the constant units 110 will be unchanged for all factorizations.

Each of the set of cofactor units 105 includes a multiplexer unit 115, such as multiplexer unit 115a in cofactor unit 105a. The outputs of the multiplexer units 115 are connected with function unit 120, such as function unit 120a in cofactor unit 105a. The function unit 120 is adapted to implement the function to be factored. If the function to be factored has M inputs, then each of the function units 120 has M inputs as well. Embodiments of the set of multiplexer units 115 may share common portions of their logic circuits across multiple cofactor units 105 to save area and device resources or alternatively each cofactor unit may have its own independent multiplexer unit to reduce path delays.

In an embodiment, each of the function units 120 is implemented as a memory storing a truth table representing the function. In an embodiment, each of the cofactor units 105 includes a separate memory storing a copy of the function's truth table. In another embodiment, two or more of the cofactor units 105 share a memory storing a copy of the function's truth table, for example using a multiport memory or by arbitrating memory access requests from multiple cofactor units 105. In embodiments where system 100 is implemented as programmable device, truth tables for functions can be loaded into the function units without the need to reconfigure the programmable device. This allows system 100 to evaluate multiple functions in sequence efficiently.

In another embodiment, each of the function units 120 is implemented as a circuit of logic gates, logic cells, or other programmable logic resources implementing the functionality of the function. In this embodiment, the arrangement of logic gates, logic cells, or other programmable logic resources does not need to be optimized for the programmable device hardware architecture. Typically, there are sufficient available programmable logic resources on a programmable device implementing system 100 to allow for inefficient implementations of the function to serve as the function units 120. Embodiments implementing function units 120 as a circuit of logic gates or equivalent programmable device resources are useful for functions too large to fit in the memory resources of the device implementing system 100. Additionally, this embodiment is useful when the truth table or BDD representation of the function is not known or is difficult to derive. This embodiment may also be efficient to implement on programmable devices that allow for partial reconfiguration.

Each of the cofactor units 105 is adapted to evaluate all of the output values of a factorization of a function for a given cofactor value. To this end, each of the cofactor units 105 iterates through all of the possible input values of the function with the cofactor inputs held constant and analyzes the resulting output values of its function unit 120. A input value counter 130 is adapted to enumerate all of the values of the non-constant inputs of the function. The input value counter 130 is connected in parallel to inputs of the multiplexer units 115 of each of the cofactor units 105.

Additional inputs of each of the multiplexer units 115 are connected to the outputs of the corresponding constant unit 110. For example, in cofactor unit 105a, N constant unit 110a outputs and M-N input value counter 130 outputs are connected to the inputs of multiplexer unit 115a. Multiplexer unit 115a thus has a total of M outputs connected with the M inputs of the function unit 120.

The multiplexer units 115 are adapted to rearrange the constant unit and input counter outputs to connected with different inputs of the function units 120, thus representing all of the possible factorizations of the M-input function into a combination of a N input and a M-N input sub-functions. Typically, if the function to be factored has M inputs and one of the sub-functions has N inputs, then there will be M choose N, which is defined as $$\frac{M!}{N!(M-N)!},$$

factorizations of the function, and thus M choose N different permutations of input assignments. For example, if a 4 input function is being factored into two 2 input sub-functions, there will be 6, which is 4 choose 2, possible factorizations of the function. For this example, these factorizations and the operation of the multiplexer units are illustrated in detail in FIGS. 2A-2F. Similarly, if a 12 input function is being factored into two 6 input sub-functions, there will be 924, which is 12 choose 6, possible factorizations of the function.

The sets of assignments of input counter unit 130 outputs and constant unit 105 outputs to function unit 120 inputs, each of which specifies a factorization of the function, are determined by input mask generator 135. Input mask generator 135 controls the multiplexer units 115. In an embodiment, input mask generator 135 is connected in parallel with the control inputs of each of the multiplexer units 115, so that each of the multiplexer units 115 has the same settings.

In an embodiment, the input mask generator 135 is implemented as a counter and state machine. The input mask generator 135 generates a set of all possible input mask values, with each input mask value having a specified number of activated multiplexer unit 115 inputs. For example, the input mask generator 135 may create a set of input mask values with three activated multiplexer inputs (set to 1 in this example). An example set could include input mask values "00111", "01011", "01101", "01110", "10010", and "10101." The number of activated multiplexer unit inputs is based how many inputs are being factored out of the given function. Input mask generator can be implemented using any type of state machine or counter configuration capable of generating (in any order) all of the possible input mask values having the specified number of activated multiplexer unit inputs.

In each cofactor unit, in response to the sequence of input values provided by the input value counter 130 and its associated constant unit 105, the cofactor unit's function unit 120 outputs a sequence of values representing the portion of the function's truth table remaining when some of the function inputs are held to a constant value. This sequence of values is input into signature generator unit 125. Each of the cofactor units 105 includes a signature generator 125. For example, the outputs of function unit 120a in cofactor unit 105a are fed to signature generator 125a.

Signature generators 125 determine the characteristics of the output of its associated function unit for each factorization analyzed. In an embodiment, signature generators 125 determine a signature, checksum, hash, or other abbreviated representation of the output of the function unit for a factorization. The signatures from each of the signature generators 125 are output to the signature analyzer 140.

Signature analyzer 140 compares the signatures from different cofactors units to determine the number of unique cofactors for a given factorization of the function. If two or more signatures match, it is very likely that the corresponding cofactors are identical. Factorizations with fewer unique cofactors typically require less logic resources to implement, as the same logic resources can be reused to represent multiple cofactors. Thus, the factorizations with the fewest unique cofactors are typically the best and should be used to implement the function.

In an alternate embodiment, if the output of the function unit is relatively small, for example when factoring a function with few inputs, the signature generators 125 can bypass the determination of the signature and provide the function unit outputs directly to the signature analyzer 140.

In further embodiments, signature generators 125 determine additional characteristics of the output of its associated function unit for each factorization. A signature unit 125 may determine if the cofactor output by an associated function unit 120 is constant, such as always zero or one. In this embodiment, each of the signature units 125 may output flag values or other indicators to signature analyzer 140 when its cofactor is a constant. In a further embodiment, signature units 125 could be configured to detect independent input signals.

In an additional embodiment, signature generators may also compare the value of its cofactor with the corresponding values of the other cofactors. In this embodiment, each of the signature units 125 may determine if its cofactor is the inverse of one or more other cofactors. In an embodiment, this determination can be made using a simple state machine. As a first one of the signature units 125 receives each bit of its cofactor in sequence, it compares this value with the values received by the other signature units 125. If the value received by the first one of the signature units ever matches one or more of the values received by the other signature units, then these matching cofactors are eliminated as a possible inverse of the cofactor. After all of the cofactor values have been received by the signature units, each of the signature units 125 may output flag values or other indicators to signature analyzer 140 when its cofactor is an inverse of another cofactor.

For example, signature units 125a, 125b, 125c, 125d, 125e, and 125f are connected together via data connections 127a, 127b, 127c, 127d, and 127e. Signature unit 125a compares the values it receives with corresponding values received by the other signature units. If the value received by signature unit 125a ever matches the corresponding value received by signature unit 125b, then the cofactor produced by cofactor unit 105b is eliminated as a possible inverse of the cofactor produced by cofactor unit 105a. This comparison is repeated for the other signature units. After all of the values of a cofactor are analyzed, any cofactor units not eliminated from consideration are inverses of the cofactor of cofactor unit 105a.

An embodiment of the signature analyzer 140 may use some or all of these attributes to identify optimal factorizations of the function. In an embodiment, the signature analyzer compares the attributes received from signature generators 125 with one or more criteria to determine whether the factorization may be optimal. Example criteria can include a maximum number of unique cofactors, a minimum number of constant and/or inverted cofactors, as well as other attributes, such as the relationships between different matching cofactors. The relationships between different matching cofactors may be considered to account for limitations or specific capabilities of the programmable device or other hardware architecture intended to implement the user design. In a further embodiment, the signature analyzer 140 could store the attributes of a factorization identified as potentially optimal. The signature analyzer 140 can then compare these stored attributes with attributes of subsequent factorizations. For example, this can be used to only return information on subsequent factorizations having attributes that meet or exceed that of a previously stored factorization.

In another embodiment, all or a portion of the signature analyzer 140 can be implemented in software executed by the device or on a user's computer system. Although this may reduce performance and increase communications bandwidth requirements, it decreases the area and device resources required for the signature analyzer 140.

If the attributes of a factorization meet or exceed the criteria specified by the signature analyzer, the signature analyzer indicates to the control and I/O unit 145 that a possible optimal factorization has been found. In response, the control and I/O unit 145 outputs from the system 100 information identifying this factorization. In an embodiment, this information can include the input mask value provided by the input mask generator 135, which represents the factorization. In an additional embodiment, the control and I/O unit 145 may also output attributes provided by the signature generators and signature analyzer, such as signatures of cofactors, the number and/or location of unique, constant, and/or inverted cofactors.

In a further embodiment, the control and I/O unit 145 also handles the initialization of system 100, such as receiving functions, in the form of truth tables or BDDs, and loading this representation into function units, resetting the input value counter 130 and input mask generator 135, and other initialization tasks.

Following the initialization of system 100, input mask generator 135 outputs a first input mask value to the set of multiplexer units 115, thereby specifying a factorization of the function. For each input mask value, the input value counter outputs a sequence of all possible function input values for the non-constant inputs of the function. In response to this sequence of function input values and each of the cofactor units 105 associated constant values, each of function units 120 outputs the corresponding cofactor, or the sequence of function output values resulting when some of the function inputs are held to a constant value. The signature generators 125 determine attributes of each of the cofactors output by the function units 120, and the signature analyzer 140 then evaluates these attributes of the cofactors to determine if the specified factorization is potentially optimal. Following this evaluation, the input mask generator 135 may specify a different factorization, the input value counter 130 is reset, and the evaluation is repeated.

Because an embodiment of system 100 generates and evaluates all of the cofactors of a factorization of a function in parallel, the amount of time required for factorization is greatly reduced. For example, if the cofactor units 105 can evaluate one set of input values every clock cycle, then a M input function factored by a N input sub-function can evaluate all of the cofactors of a factorization in approximately $2^{M-N}$ clock cycles. Further, all possible factorizations of the M input function factored by a N input sub-function can be evaluated in approximately $2^{M-N} \times M$ choose N clock cycles, excluding any clock cycles possibly required for overhead, such as configuring a programmable device to implement system 100, loading one or more functions into the system 100, analyzing attributes in signature analyzer 140, and/or communicating the results of the analysis to the user's computer system or compilation software. Typical implementations of system 100 on low-cost programmable device hardware can operate at 100 Mhz or more, enabling optimal factorings of functions of 12 inputs to be found in a few milliseconds, including overhead time. This is often a thousand or more times faster than prior factorization techniques implemented on general purpose computers operating at gigahertz speeds.

In further embodiments, system 100 can be applied recursively to functions to evaluate more complex factorizations. In an additional embodiment, system 100 can be used to accelerate Boolean satisfiability solvers. In this embodiment, the function units implement a Boolean satisfiability function representing the constraints, often referred to as clauses, of a particular problem. The function units may be implemented as logic circuits or lookup tables, as described above. In this embodiment, the signature generators are adapted to identify the number and locations of 1 values in the outputs of the function units. These 1 values correspond with input values consistent with the Boolean satisfiability function.

FIGS. 2A-2F illustrate example multiplexer configurations suitable for use with an embodiment of the invention. These example multiplexer configurations illustrate the how a multiplexer unit implements different factorizations of a function. In these figures, an example function F has four inputs (A, B, C, D). This example function is for the purposes of illustration and typical applications of embodiments of the invention will include more complicated functions with any arbitrary number of function inputs.

FIG. 2A illustrates a first factorization 200 of this example function as implemented using an embodiment of the invention. In this example 200, a function unit 203a as described above includes a representation of the function F, which as described above may be implemented as a lookup table or a logic circuit. Function unit 203 includes four inputs 204a-204d, corresponding with inputs A-D of function F, respectively. Function unit 203 includes a function output 207, which is adapted to output the value of function F for a set of input values on inputs 204a-204d.

The inputs 204a-204d of function unit 203 are connected with a multiplexer unit 205. The multiplexer unit 205 includes four inputs 206a-206d. Inputs 206a and 206b are connected with two outputs of an input counter unit, similar to that described above. These counter outputs, labeled C1 and C2 will provide a sequence of all possible input values, which in this example is the set of values (in binary) of 0, 1, 2, and 3. Inputs 206c and 206d are connected with the outputs of a constant unit, similar to that described above. The constant unit outputs, labeled K1 and K2, will remain fixed at a constant value. Each cofactor unit operating in parallel will have a constant unit outputting a different constant value.

Multiplexer unit 205 can connect its inputs 206a-206d to the function unit inputs 204a-204d in any permutation. By rearranging the mapping of constant and counter unit outputs to function unit inputs, the function F is factored by different sub-functions. As discussed above, the multiplexer unit settings are controlled by the input mask generator. In factorization 200, the counter outputs 206a and 206b are connected with function unit inputs 204a and 204b, representing function inputs A and B, and the constant unit outputs 206c and 206d are connected with the function inputs 204c and 204d, representing function inputs C and D. This configuration of multiplexer unit 205 corresponds to factoring a sub-function with inputs C and D from function F.

FIG. 2B illustrates a second factorization 215 of this example function as implemented using an embodiment of the invention. In this example factorization 215, the counter outputs 206a and 206b are connected with function unit inputs 204c and 204d, representing function inputs C and D, and the constant unit outputs 206c and 206d are connected with the function inputs 204a and 204b, representing function inputs A and B. This configuration of multiplexer unit 205 corresponds to factoring a sub-function with inputs A and B from function F.

FIG. 2C illustrates a second factorization 230 of this example function as implemented using an embodiment of the invention. In this example factorization 230, the counter outputs 206a and 206b are connected with function unit inputs 204a and 204d, representing function inputs A and D, and the constant unit outputs 206c and 206d are connected with the function inputs 204b and 204c, representing function inputs B and C. This configuration of multiplexer unit 205 corresponds to factoring a sub-function with inputs B and C from function F.

Figures 2D, 2E, 2F:
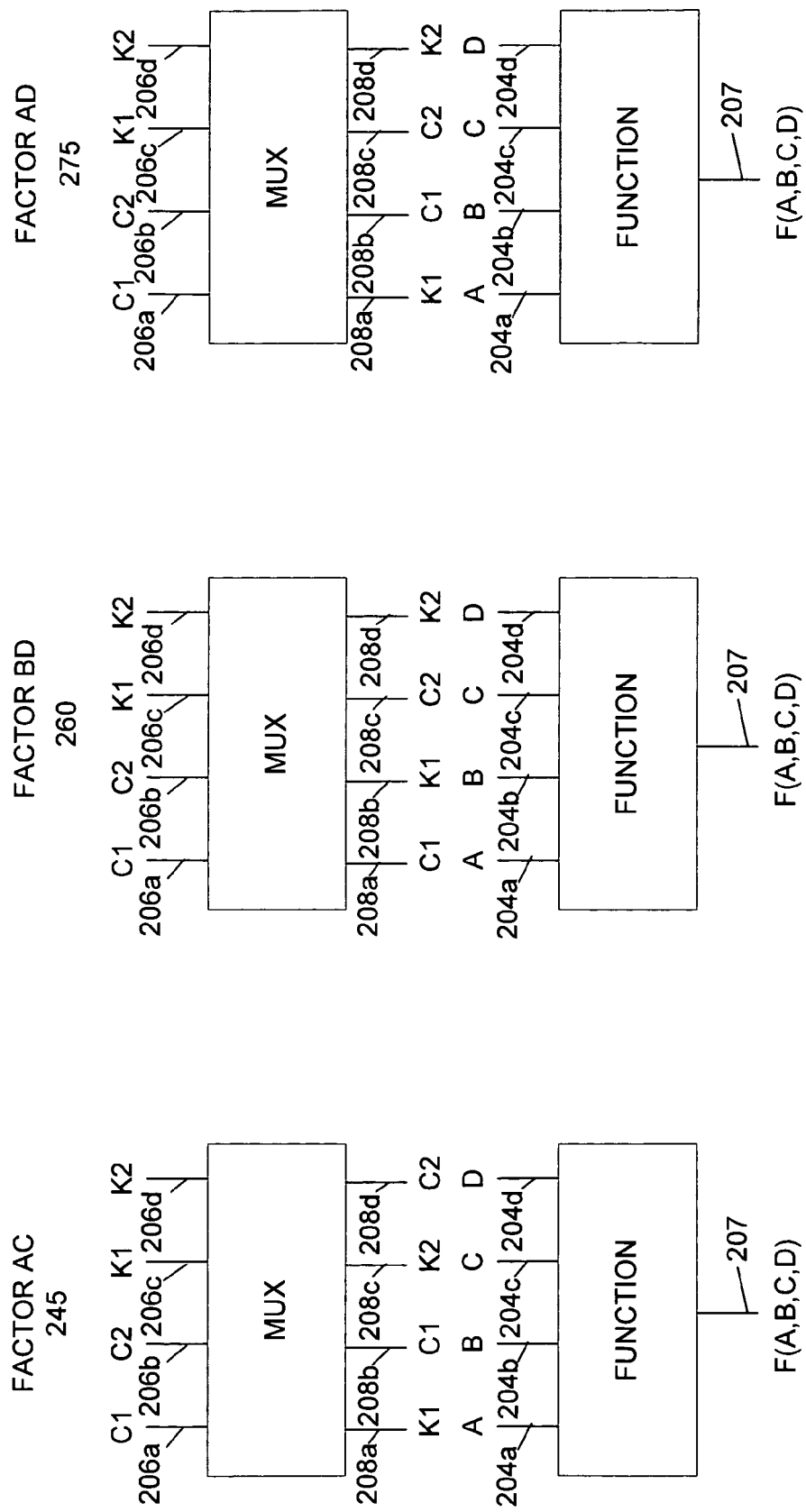

FIG. 2D illustrates a second factorization 245 of this example function as implemented using an embodiment of the invention. In this example factorization 245, the counter outputs 206a and 206b are connected with function unit inputs 204b and 204d, representing function inputs B and D, and the constant unit outputs 206c and 206d are connected with the function inputs 204a and 204c, representing function inputs A and C. This configuration of multiplexer unit 205 corresponds to factoring a sub-function with inputs A and C from function F.

FIG. 2E illustrates a second factorization 260 of this example function as implemented using an embodiment of the invention. In this example factorization 260, the counter outputs 206a and 206b are connected with function unit inputs 204a and 204c, representing function inputs A and C, and the constant unit outputs 206c and 206d are connected with the function inputs 204b and 204d, representing function inputs B and D. This configuration of multiplexer unit 205 corresponds to factoring a sub-function with inputs B and D from function F.

FIG. 2F illustrates a second factorization 275 of this example function as implemented using an embodiment of the invention. In this example factorization 275, the counter outputs 206a and 206b are connected with function unit inputs 204b and 204c, representing function inputs B and C, and the constant unit outputs 206c and 206d are connected with the function inputs 204a and 204d, representing function inputs A and D. This configuration of multiplexer unit 205 corresponds to factoring a sub-function with inputs A and D from function F.

Figure 3B:
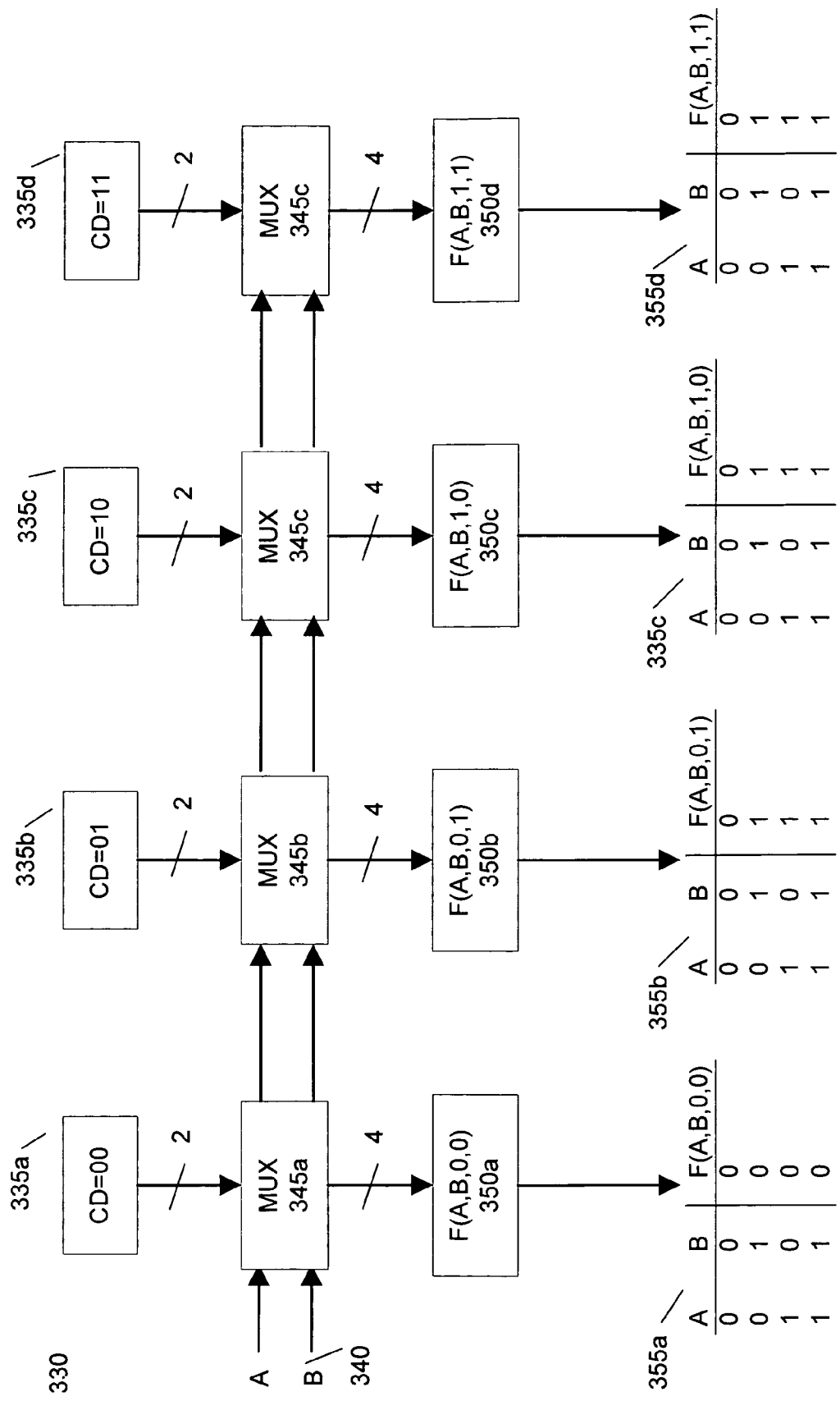
Figure 3C:
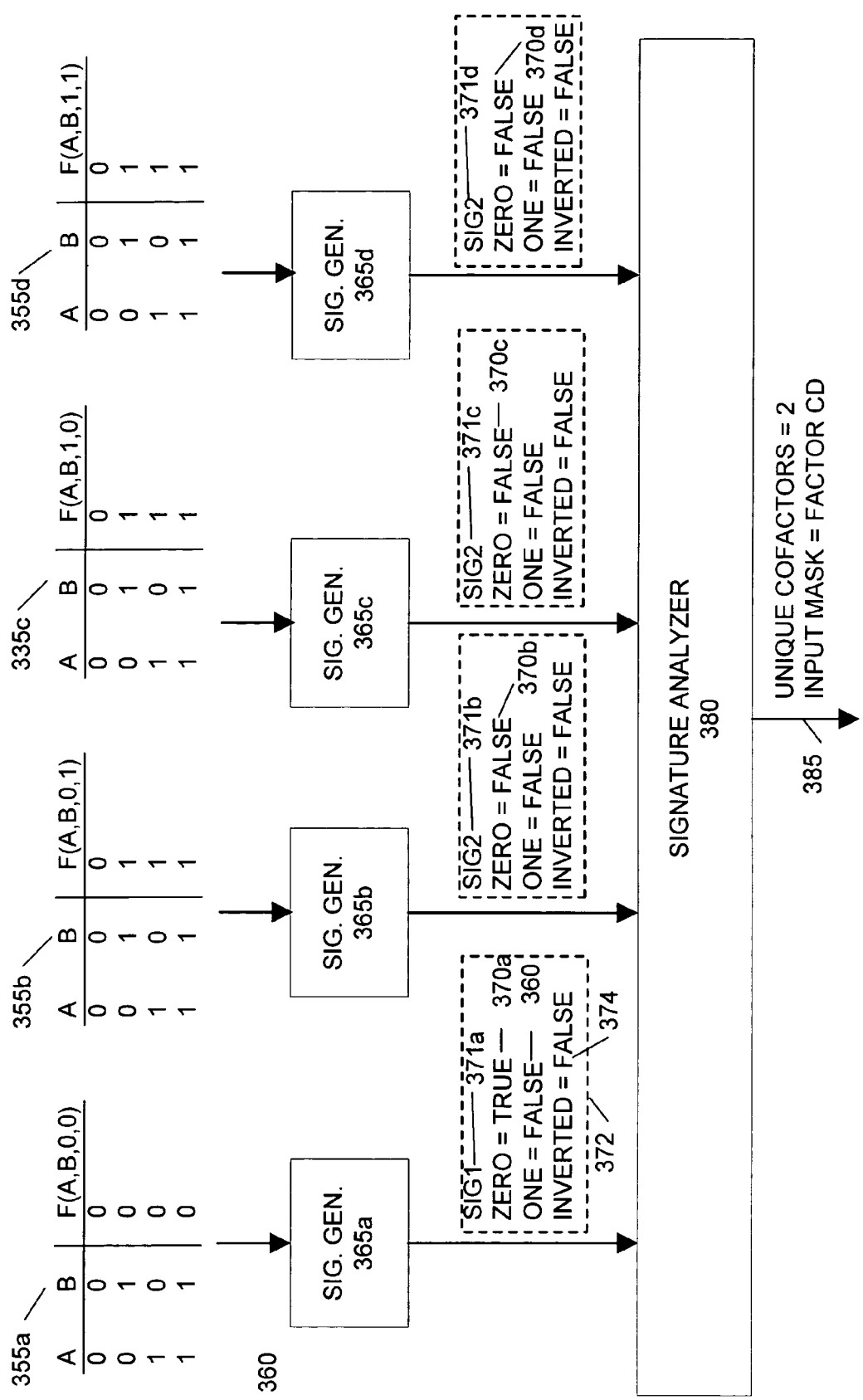

FIGS. 3A-3C illustrate the operation of an embodiment of the invention in evaluating a factorization of an example function. FIG. 3A illustrates a truth table 300 representing an example function F=(A+B)(C+D). This example function is for the purposes of illustration and typical applications of embodiments of the invention will include more complicated functions with any arbitrary number of function inputs.

FIG. 3B illustrates a portion of a simplified system 330 of an embodiment of the invention evaluating one possible factorization of the example function F by a sub-function with input variables C and D. This factorization will express F as a combination of a first sub-function with input variables C and D and a second sub-function with input variables of A and B (and potentially C and/or D as well, depending upon the function F). System 330 includes four cofactor units 335A-335D. Each of the cofactor units 335 is assigned to evaluate the values of function F for a constant value of input variables C and D. In this example, cofactor unit 335a evaluates F with C and D set to binary 00, cofactor unit 335b evaluates F with C and D set to binary 01, cofactor unit 335c evaluates F with C and D set to binary 10, and cofactor unit 335d evaluates F with C and D set to binary 11.

With the multiplexer units holding inputs C and D of each cofactor unit's 335 function unit to its respective constant value, an input counter unit supplies a sequence of all possible input values of input variables A and B to multiplexer unit 345 inputs 340. In response to the sequence of values of A and B and the constant values of C and D, each of the function units 350 outputs one of the cofactors 355 of the function F. For example, function unit 350a outputs cofactor 355a of function F, which corresponds to rows 302a-302d of the truth table 300 in FIG. 1 where inputs C and D are set to 00.

Similarly, cofactor 355b corresponds to rows 303a-303d of truth table 300; cofactor 355c corresponds with rows 304a-304d of truth table 300; and cofactor 355d corresponds with rows 305a-305d of truth table 300.

FIG. 3C illustrates a second portion 360 of an embodiment of the invention evaluating one possible factorization of the example function F by a sub-function with input variables C and D. Continuing with the example discussed with reference to FIGS. 3A and 3C, portion 360 analyzes the cofactors output by each function unit. In this example, function units 350a-350d, shown in FIG. 3B output cofactors 355a-355d, respectively, to signature generators 365a-365d. Signature generators 365 determine a hash or other type of signature based on the values of the cofactors. Signature generators 365 also determine the values of one or more flags or other indicators of attributes of the cofactors.

In this example, signature generators 365 output a signature of the cofactor, attributes specifying if the cofactor is a constant zero or one, and an attribute indicating if the cofactor is an inverse of another cofactor. For example, based on cofactor 355a, signature generator 365a outputs data 370a including a first signature value 371a, indicators 372 and 373 specifying that cofactor 355a is constant zero for this factorization, and indicator 374 specifying that cofactor 355a is not the inverse of any of the other cofactors 355b-355d.

Similarly, signature generators 365b, 365c, and 365d output data 370b, 370c, and 370c, respectively. Data 370b-370d include signature values 371b-371d. In this example, signature values 371b-371d are all equal.

The data 370 output by all of the cofactors units is received by signature analyzer 380. Signature analyzer 380 compares the signature values from each of the signature generators 365 to identify the number of unique cofactors. In this example, because signature values 371b-371d are all equal, it is highly likely (barring a hash collision) that cofactors 355b, 355c, and 355d are equal. Thus, signature generator 380 determines that there are only two unique cofactors. If the number of unique cofactors or other cofactor attributes, such as the number of constant or inverted cofactors, satisfies the criteria of the signature analyzer 380, signature analyzer 380 outputs information 385 identifying this factorization, such as the number of unique cofactors and the input mask values specifying the factorization. This information is then used by the compilation software application to optimize the user's design.

Figure 4:
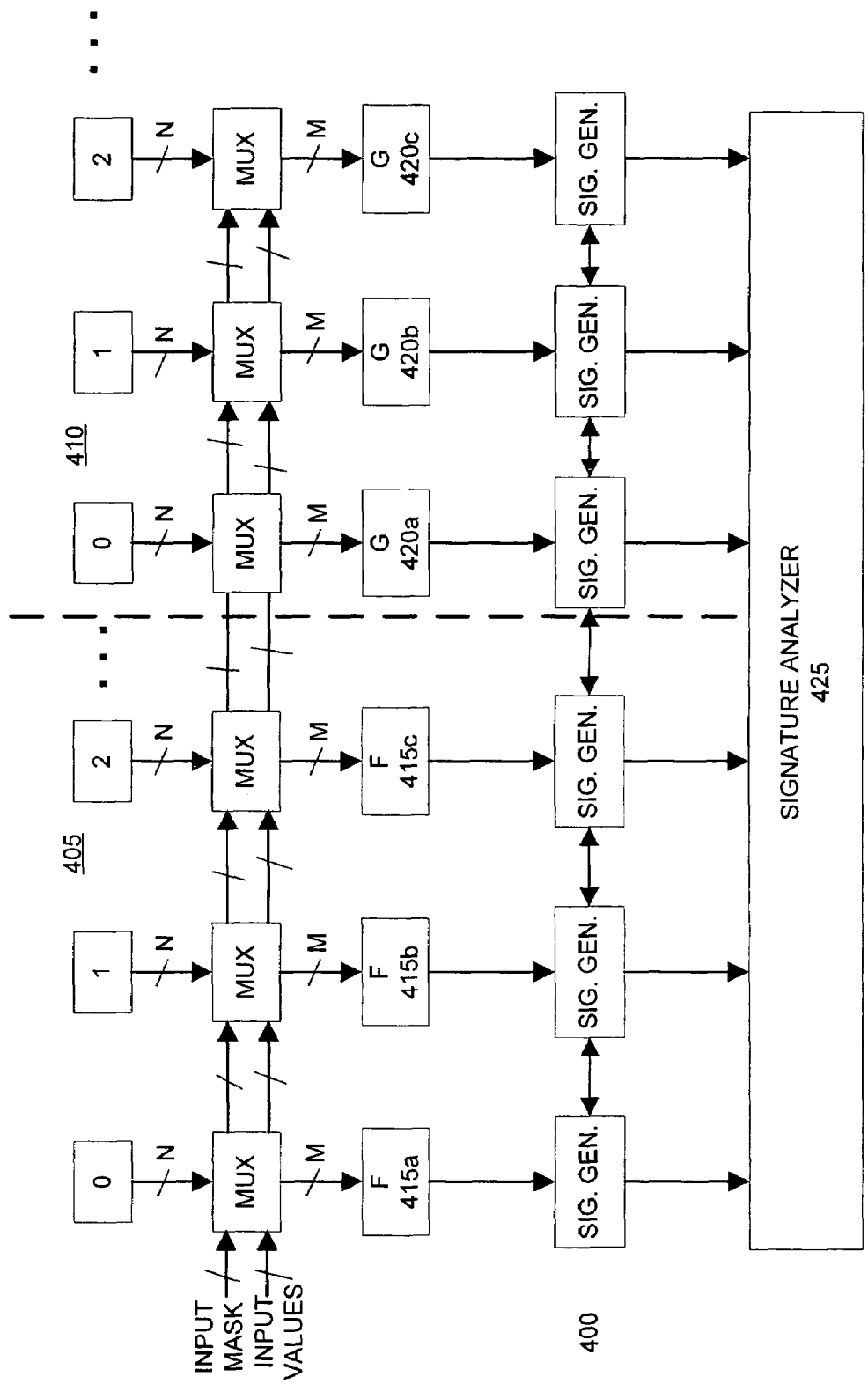
FIG. 4 illustrates a function factoring accelerator system adapted to factor multiple functions according to an embodiment of the invention.

FIG. 4 illustrates a function factoring accelerator system 400 adapted to factor multiple functions according to an embodiment of the invention. System 400 is substantially similar to system 100 discussed above. For clarity, the control and I/O unit, the input value counter, and the input mask generator have been omitted from FIG. 4 but operate in the same manner as described above.

In system 400, the set of cofactor units is partitioned into at least two portions, portions 405 and 410. In portion 405, the function units 415 of the cofactor units implement a first function, function F. In portion 410, the function units 420 of the cofactor units implement a second function, function G. The cofactor units 415 and 420 of portions 405 and 410 operate simultaneously and in parallel. This enables system 400 to evaluate cofactors of functions F and G simultaneously. In an embodiment, signature analyzer evaluates the signatures associated with the cofactors of function F and G both separately and together. This allows system 400 to determine if a factorization of F and G is optimal for both functions. For example, from the signatures from the cofactors units of portions 405 and 410, signature analyzer 425 may determine that some cofactors of function F are equal to some cofactors of function G. As a result, this factorization of functions F and G may be able to share logic, increasing performance and reducing the resources required for the user's design.

Figure 5:
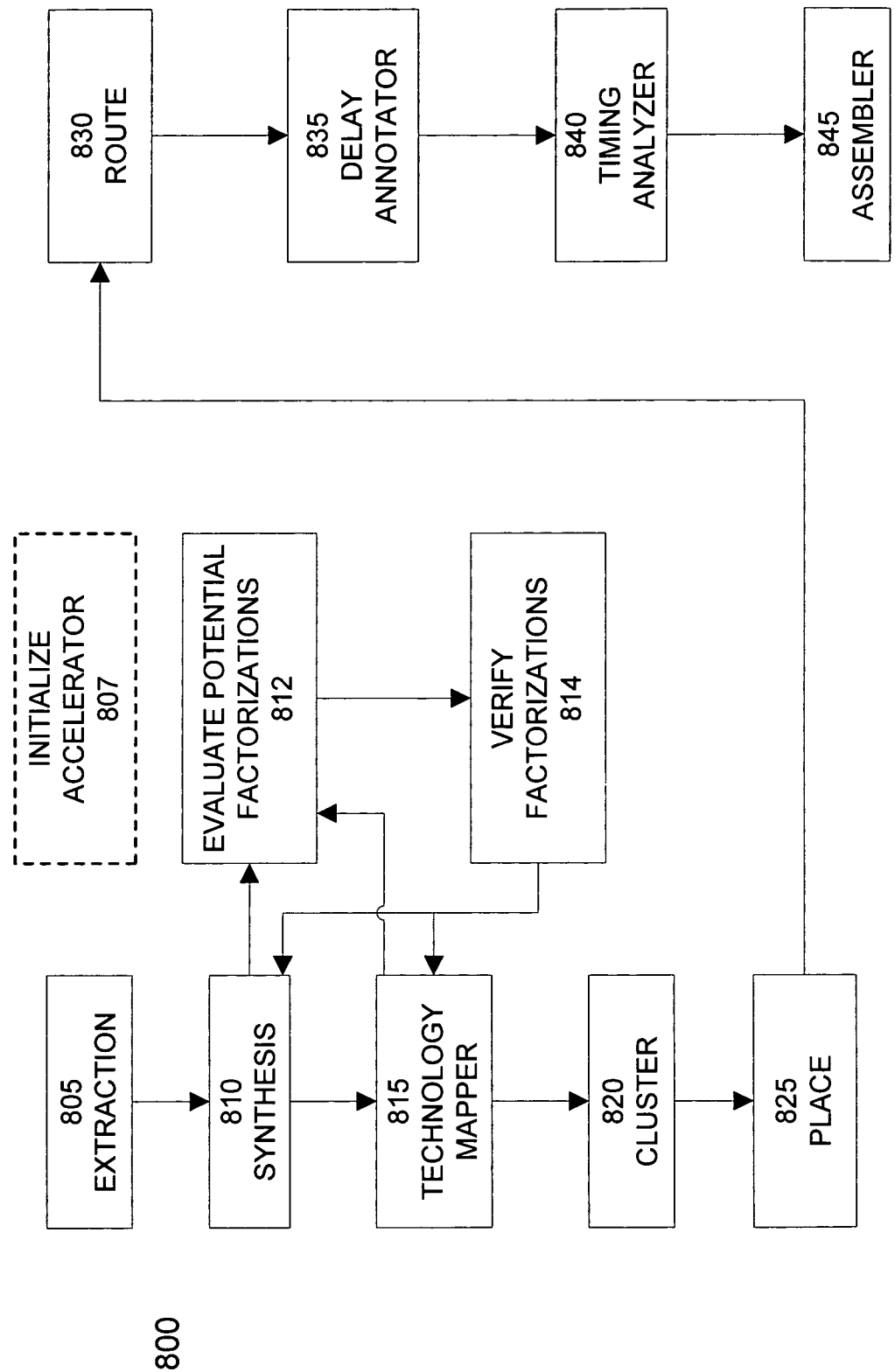
FIG. 5 illustrates a compilation process suitable for use with an embodiment of the invention.

FIG. 5 illustrates an example compilation process 800 suitable for use with an embodiment of the invention. The compilation process 800 converts a user design into a programmable device configuration adapted to configure a programmable device to implement the user design. The extraction phase 805 converts a description of the user design, expressed for example in a hardware description language, into a register transfer layer description.

Synthesis phase 810 converts the register transfer layer description of the user design into a set of logic gates. Technology mapping phase 815 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design. For other types of devices, technology mapping phase 815 and the cluster phase 820, discussed below, may be omitted or replaced with other compilation phases specific to the type of device.

As discussed above, an embodiment of the function factoring accelerator is used by a synthesis phase 810 and/or technology mapping phase 815 to optimize portions of the design. In an embodiment, the accelerator system is initialized in phase 807. If the accelerator is implemented using a programmable device, phase 807 loads a programmable device configuration into the programmable device to implement the accelerator system.

Typically, it may take several minutes to optionally prepare and load a programmable device configuration into a programmable device. Thus, in an embodiment, phase 807 is initiated prior to phases 810 and 815 and is performed in parallel with extraction phase 805. In this embodiment, it is desirable, if possible, to complete phase 807 prior to phases 810 and/or 815, so that the compilation process 800 does not stall while waiting for the programmable device to be configured to serve as an accelerator system. In applications where the function units of the accelerator are implemented as lookup tables, the programmable device needs to be loaded with configuration data only one time to evaluate multiple functions.

In other embodiments, phase 807 is during phases 810 and 815. If the function units are implemented as logic circuits on a programmable device, then configuration data representing these function units must be generated by phases 810 and/or 815, when functions in need of factorization are identified. In this embodiment, all or part of the configuration data, representing the accelerator system or at least the function units of the accelerator system, must be loaded into the programmable device each time a new function is to be analyzed.

During phases 805 and 810, functions representing portions of the user's design are generated. Functions in need of optimization via factoring are loaded from the user's computer system into the accelerator system. In phase 812, all or a portion of the possible factorizations of these functions are evaluated by the accelerator system, as described above. Information on factorizations that are promising, based on the criteria specified in the signature analyzer of the accelerator system, are then transferred back to the user's computer system. The transfer of functions and data between the user's computer system and the accelerator system is facilitated by an application programming interface.

Following phase 812, phase 814 verifies the validity of the factorizations of the identified by the accelerator system in phase 812. In an embodiment, phase 814 is performed by the user's computer system. Typically, phase 812 identifies only a small portion of function's possible factorizations as promising. Thus, phase 814 requires very little time to perform. Function factorizations passing the verification phase 814 are then used by phases 810 and 815 to optimize the synthesis and technology mapping of the user's design.

Following the technology mapping phase 815, the cluster phase 820 groups related atoms together into clusters. The placement phase 825 assigns clusters of atoms to locations on the programmable device. The route phase 830 determines the configuration of the configurable switching circuit of the programmable device used to connect the atoms implementing the user design.

The delay annotator phase 835 determines the signal delays for the set of atoms and their associated connections in the configurable switching circuit using a timing model of the programmable device. The timing analysis phase 840 determines the maximum operating speed of the programmable device when implementing the user design, for example by determining the portions of the user design have the largest signal delay.

The assembler phase 845 generates a set of configuration information specifying the configuration of the programmable device implementing the user design, including the configuration of each of the logic cells used to implement the user design and the configuration of the configurable switching circuit used to connect the logic cells. The assembler phase 845 can write the configuration information to a configuration file, which can then be used to configure one or more programmable devices to implement instances of the user design.

Figure 6:
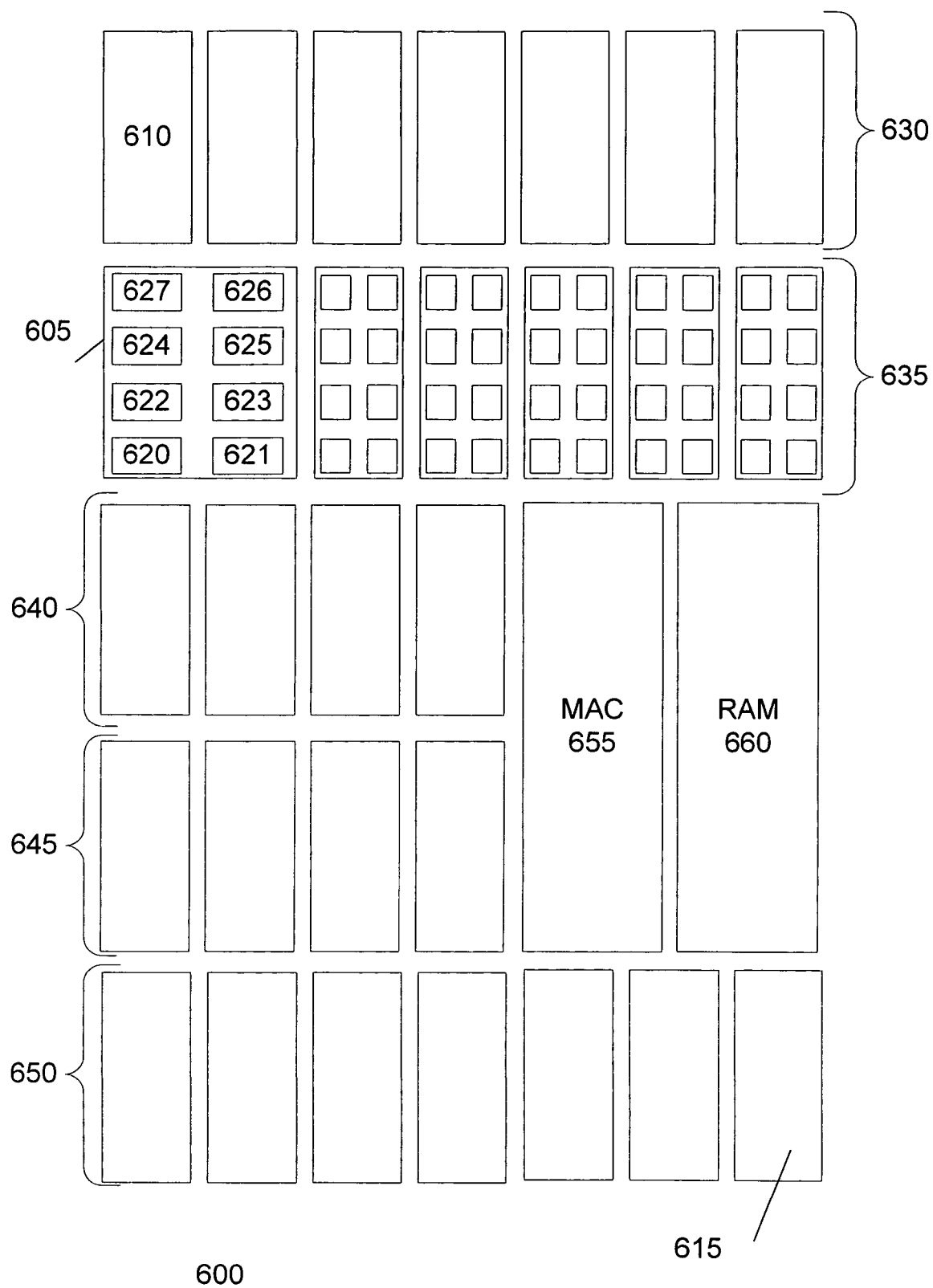
FIG. 6 illustrates an example programmable device 600 suitable for implementing an embodiment of the invention.

FIG. 6 illustrates an example programmable device 600 suitable for implementing an embodiment of the invention. Programmable device 600 includes a number of logic array blocks (LABs), such as LABs 605, 610, 615. Each LAB includes a number of programmable logic cells using logic gates and/or look-up tables to perform a logic operation. LAB 605 illustrates in detail logic cells 620, 621, 622, 623, 624, 625, 626, and 627. Logic cells are omitted from other LABs in FIG. 6 for clarity. The LABs of device 600 are arranged into rows 630, 635, 640, 645, and 650. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently.

In addition to logic cells arranged in LABs, programmable device 600 also include specialized functional blocks, such as multiply and accumulate block (MAC) 655 and random access memory block (RAM) 660. For clarity, the portion of the programmable device 600 shown in FIG. 6 only includes a small number of logic cells, LABs, and functional blocks.

Typical programmable devices will include thousands or tens of thousands of these elements.

Figure 7A:
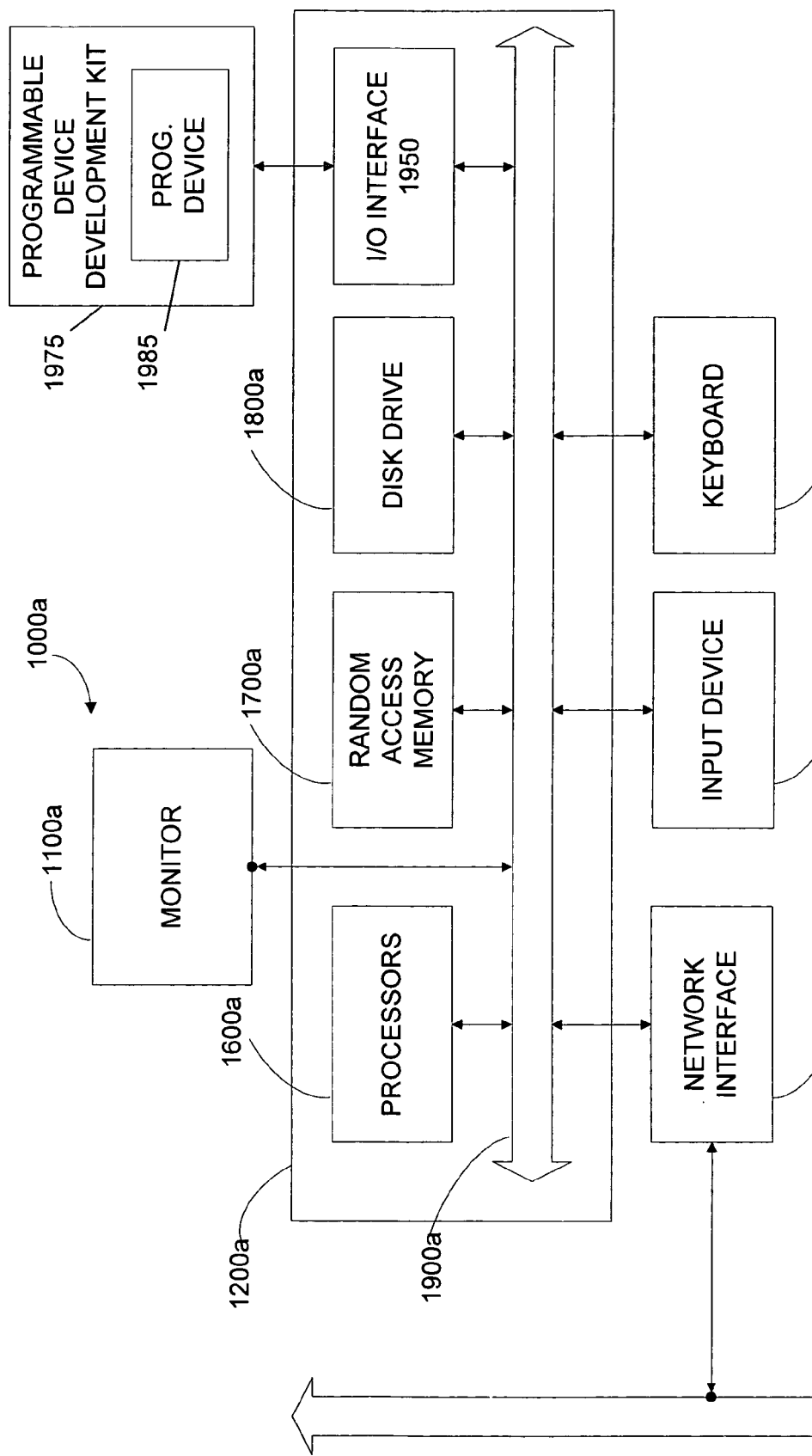
FIGS. 7A-7B illustrate example computer systems suitable for use with an embodiment of the invention.
Figure 7B:
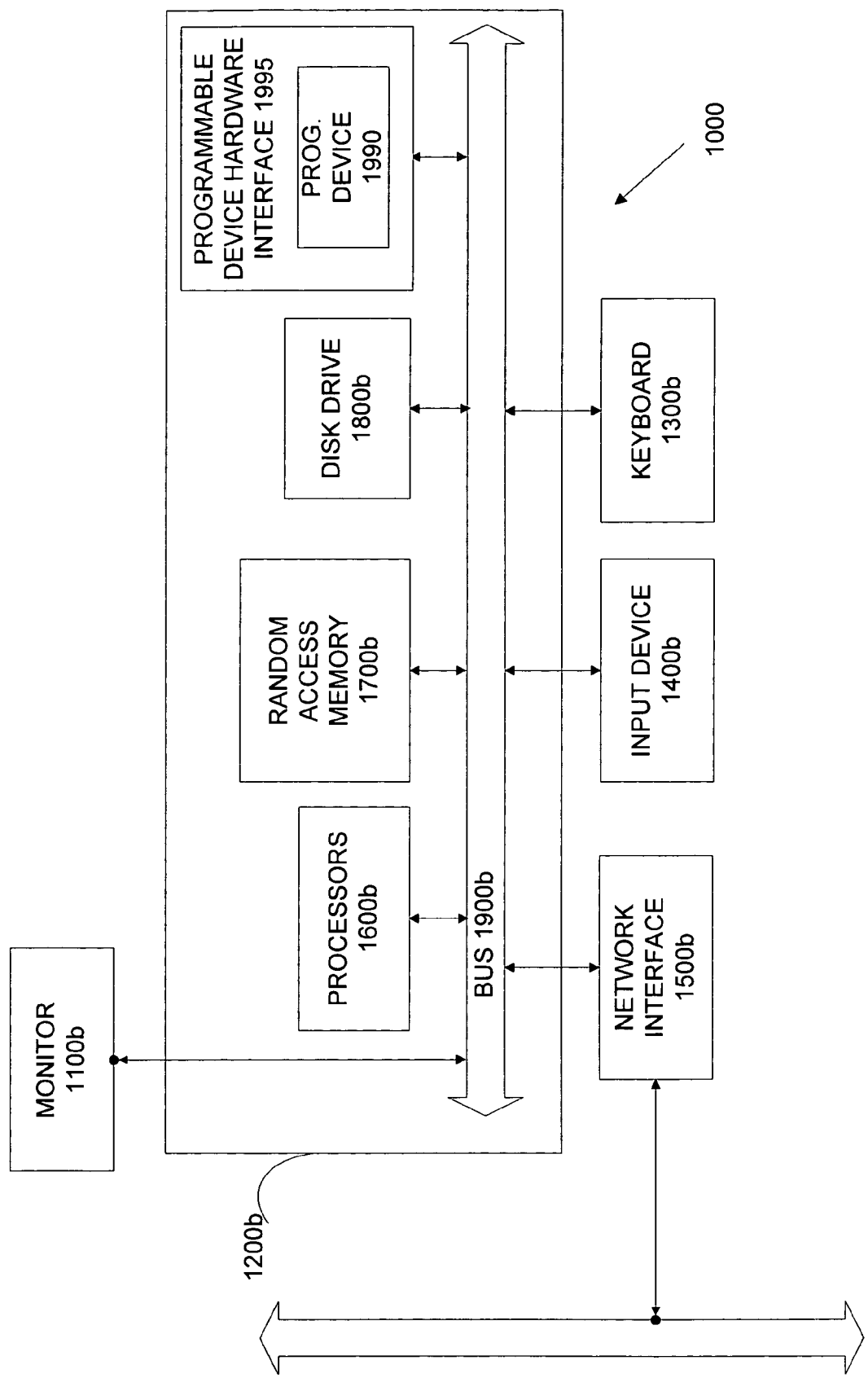

FIGS. 7A-7B illustrate example computer systems suitable for use with an embodiment of the invention. Computer 1200a typically includes components such as one or more general purpose processors 1600a, and memory storage devices, such as a random access memory (RAM) 1700a, disk drives 1800a, and system bus 1900a interconnecting the above components. RAM 1700a and disk drive 1800a are examples of tangible media for storage of data, audio/video files, computer programs, applet interpreters or compilers, virtual machines, and embodiments of the herein described invention. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

An embodiments of computer 1200a include an I/O interface 1950 adapted to handle input, output, and communications with a programmable device development system 1975. Example interfaces can include standard wired or wireless communications interfaces, such as USB, firewire, and Bluetooth interfaces, as well as interfaces specialized for electronic system development and testing, such as JTAG and SPI.

Programmable device development system 1975 includes a programmable device 1985, such as an FPGA as described above. Programmable device development system 1975 may also include additional supporting hardware, such as I/O and/or programming interfaces for the programmable device 1985, and volatile or non-volatile memory for storing configuration information for the programmable device 1985.

Embodiments of the invention in conjunction with computer system 1200a are well-suited for applications in which the user design is also intended for a programmable device or structured ASIC. For these applications, the user will often already have a programmable device development kit 1975, which allows embodiments of the invention to be implemented with no additional hardware or expenses. Alternatively, users may elect to acquire a programmable device development kit solely for the purpose of accelerating factorization using embodiments of the invention for any type of digital device design.

Computer 1200b typically includes components such as one or more general purpose processors 1600b, and memory storage devices, such as a random access memory (RAM) 1700b, disk drives 1800b, and system bus 1900b interconnecting the above components. RAM 1700b and disk drive 1800b are examples of tangible media for storage of data, audio/video files, computer programs, applet interpreters or compilers, virtual machines, and embodiments of the herein described invention. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

An embodiments of computer 1200b include a programmable device hardware interface 1995 adapted to handle input, output, and communications with a programmable device development system 1975. Interface 1995 may be an internal or external interface to computer 1200b. Example interfaces can include standard wired or wireless external communications interfaces, such as USB, firewire, and Bluetooth interfaces; internal interfaces such as PCI, PCI-E, and PCI-X; dedicated microprocessor interfaces, as well as interfaces specialized for electronic systems applications, development and testing, such as JTAG and SPI.

Programmable device hardware interface 1995 includes a programmable device 1990, such as an FPGA as described above. Programmable device hardware interface 1995 may also include additional supporting hardware, such as I/O and/or programming interfaces for the programmable device 1990, and volatile or non-volatile memory for storing configuration information for the programmable device 1990.

Embodiments of the invention in conjunction with computer system 1200b may be used for applications in which the user design is intended for a programmable device or structured ASIC, as well as for any other general digital device design.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A system for identifying factorizations of a function, the system comprising:
    an input value circuit including logic adapted to generate a set of function input values;
    a factorization circuit including logic adapted to specify a factorization of a function, wherein the function represents a portion of a user design;
    a plurality of cofactor unit circuits adapted to operate in parallel and responsive to the input value and the factorization circuit, wherein each cofactor unit circuit includes logic adapted to generate a cofactor of the factorization of a function for the set of function input values and logic adapted to determine at least one attribute of the cofactor of the function; and
    a cofactor analysis unit including logic adapted to compare the attributes of cofactors determined by the plurality of cofactor unit circuits with at least one criteria, and when the at least one criteria is met, to provide information identifying the factorization of the function, else to not provide the information identifying the factorization of the function.

2. The system of claim 1, further comprising:
    an I/O interface circuit including logic adapted to receive a representation of the function.

3. The system of claim 2, wherein the representation of the function includes lookup table data.

4. The system of claim 2, wherein the I/O interface circuit is adapted to receive the representation of the function from a design compilation software application executing on a computer system.

5. The system of claim 1, further comprising:
an I/O interface circuit including logic adapted to output data including the factorization of the function in response to the determination that the at least one criteria has been met.

6. The system of claim 5, wherein the I/O interface circuit is adapted to output the data including the factorization to a design compilation software application executing on a computer system.

7. The system of claim 1, wherein the logic adapted to generate a cofactor of the factorization of a function includes:
a function unit circuit adapted to implement the function and having a plurality of function inputs; and
a multiplexer unit circuit including logic adapted to hold a first portion of the function inputs to a constant value and to communicate the set of function input values to a second portion of the function inputs.

8. The system of claim 7, wherein the function unit circuit comprises:
a lookup table memory implementing the function.

9. The system of claim 7, wherein the function unit circuit comprises:
a logic circuit implementing the function.

10. The system of claim 9, wherein the logic circuit implementing the function comprises programmable logic elements programmed to emulate logic gates corresponding with the function.

11. The system of claim 1, wherein the logic adapted to determine at least one attribute of the cofactor of the function comprises:
a signature generator unit including logic adapted to determine a digital signature of the cofactor.

12. The system of claim 1, wherein the logic adapted to determine at least one attribute of the cofactor of the function comprises:
logic adapted to if provide an indication when the cofactor is a constant value.

13. The system of claim 1, wherein the logic adapted to determine at least one attribute of the cofactor of the function comprises:
logic adapted to provide an indication when the cofactor generated by one of the plurality of cofactor unit circuits is an inverse of a second cofactor generated by a different one of the plurality of cofactor unit circuits.

14. The system of claim 1, wherein the logic adapted to determine at least one attribute of the cofactor of the function comprises:
logic adapted to determine the locations of portions of the cofactor equal to 1.

15. The system of claim 1, further comprising:
a second plurality of cofactor unit circuits adapted to operate in parallel and responsive to the input value and factorization circuits, wherein each of the second plurality of cofactor unit circuits includes logic adapted to generate a cofactor of the factorization of a second function for the set of input values and logic adapted to determine at least one attribute of the cofactor of the second function;
wherein, the cofactor analysis unit includes logic adapted to compare the attributes of cofactors of the second function determined by the second plurality of cofactor unit circuits with the at least one criteria, and when the at least one criteria is met, then to provide information identifying the factorization of the second function, else to not provide information identifying the factorization of the second function.

16. The system of claim 1, wherein the cofactor analysis unit includes logic adapted to compare the attributes of cofactors of the factorizations of the function and the second function with the at least one criteria, and when the at least one criteria is met, then to provide information identifying the factorization of the function and the second function, else to not provide information identifying the factorization of the function and the second function.

17. The system of claim 1, wherein the system is implemented using a programmable device.

18. The system of claim 17, wherein the programmable device is configured to implement the system by configuration data provided by a design compilation software application executing on a computer system.

19. The system of claim 18, wherein the configuration data includes a specification of an implementation of the function using the programmable device.

20. The system of claim 17, wherein the programmable device is included in a programmable device development system connected with a computer system.

21. The system of claim 17, wherein the programmable device is included in an internal expansion card connected with an expansion slot of a computer system.

22. The system of claim 17, wherein the programmable device is included in a coprocessor card connected with a processor slot of a computer system.

23. A system for identifying factorizations of a function, the system comprising:
a factorization circuit to specify a factorization of a first function, wherein the function represents a portion of a user design;
a plurality of cofactor unit circuits to operate in parallel, responsive to the factorization circuit, and to receive a set of function input values, wherein each cofactor unit circuit generates a cofactor of the factorization of a function for the set of function input values and determines at least one attribute of the cofactor of the first function; and
a cofactor analysis unit to compare the attributes of cofactors determined by the plurality of cofactor unit circuits with at least one criteria.

24. The system of claim 23, wherein when the at least one criteria is met, information including the factorization of the first function is provided, otherwise information including the factorization of the first function is not provided.

25. The system of claim 23, wherein when the at least one criteria is met, information identifying the factorization of the first function is provided, otherwise the information identifying the factorization of the first function is not provided.

26. The system of claim 25, wherein when the at least one criteria is met, information identifying the factorization of the first function is provided is provided to a compiler.

27. The system of claim 26, wherein the compiler uses the information identifying the factorization of the first function to implement the user design on a programmable device.

28. The system of claim 23, wherein logic to generate a cofactor of the factorization of a first function includes:
a function unit circuit to implement the first function and having a plurality of function inputs; and
a multiplexer unit circuit to hold a first portion of the function inputs to a constant value and to communicate the set of function input values to a second portion of the function inputs.

29. The system of claim 23, further comprising:
a second plurality of cofactor unit circuits to operate in parallel and responsive to the input value and factorization circuits, wherein each of the second plurality of cofactor unit circuits generates a cofactor of the factorization of a second function for the set of input values and determines at least one attribute of the cofactor of the second function;

wherein, the cofactor analysis unit compares the attributes of cofactors of the second function determined by the second plurality of cofactor unit circuits with the at least one criteria, and when the at least one criteria is met, then provides information identifying the factorization of the second function, else does not provide the information identifying the factorization of the second function.

30. The system of claim 23, wherein the cofactor analysis unit compares the attributes of cofactors of the factorizations of the function and the second function with the at least one criteria, and when the at least one criteria is met, then provides information identifying the factorizations of the first function and the second function, else does not provide the information identifying the factorization of the first function and the second function.

31. A system for identifying factorizations of a function, the system comprising:
- a factorization circuit to specify a factorization of a first function, wherein the function represents a portion of a user design;
- a plurality of cofactor unit circuits to operate in parallel, responsive to the factorization circuit, and to receive a set of function input values, wherein each cofactor unit circuit generates a cofactor of the factorization of a function for the set of function input values and determines at least one attribute of the cofactor of the first function; and
- a cofactor analysis unit to compare the attributes of cofactors determined by the plurality of cofactor unit circuits with at least one criteria, and when the at least one criteria is met, information identifying the factorization of the first function is provided to a compiler, otherwise the information identifying the factorization of the first function is not provided to the compiler,
- wherein the compiler uses the information identifying the factorization of the first function to implement the user design on a programmable device.

32. The system of claim 31, wherein logic to generate a cofactor of the factorization of a first function includes:
- a function unit circuit to implement the first function and having a plurality of function inputs; and
- a multiplexer unit circuit to hold a first portion of the function inputs to a constant value and to communicate the set of function input values to a second portion of the function inputs.

33. The system of claim 31, wherein the function unit circuit comprises:
- a lookup table memory implementing the first function.

34. The system of claim 31, wherein the function unit circuit comprises:
- a logic circuit implementing the first function.

35. The system of claim 31, further comprising:
- a second plurality of cofactor unit circuits to operate in parallel and responsive to the input value and factorization circuits, wherein each of the second plurality of cofactor unit circuits generates a cofactor of the factorization of a second function for the set of input values and determines at least one attribute of the cofactor of the second function;
- wherein, the cofactor analysis unit compares the attributes of cofactors of the second function determined by the second plurality of cofactor unit circuits with the at least one criteria, and when the at least one criteria is met, then provides information identifying the factorization of the second function, else does not provide the information identifying the factorization of the second function.

36. The system of claim 31, wherein the cofactor analysis unit compares the attributes of cofactors of the factorizations of the function and the second function with the at least one criteria, and when the at least one criteria is met, then provides information identifying the factorizations of the first function and the second function, else does not provide the information identifying the factorization of the first function and the second function.

* * * * *

UNITED STATES PATENT AND TRADEMARK OFFICE
CERTIFICATE OF CORRECTION

| | | |
|---|---|---|
| PATENT NO. | : 7,640,528 B1 | Page 1 of 1 |
| APPLICATION NO. | : 11/499514 | |
| DATED | : December 29, 2009 | |
| INVENTOR(S) | : Gregg William Baeckler | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 596 days.

Signed and Sealed this

Twenty-first Day of December, 2010

David J. Kappos
*Director of the United States Patent and Trademark Office*